United States Patent
Huo et al.

(10) Patent No.: US 7,368,788 B2
(45) Date of Patent: May 6, 2008

(54) SRAM CELLS HAVING INVERTERS AND ACCESS TRANSISTORS THEREIN WITH VERTICAL FIN-SHAPED ACTIVE REGIONS

(75) Inventors: Zong-Liang Huo, Gyeonggi-do (KR); Seung-Jae Baik, Seoul (KR); In-Seok Yeo, Seoul (KR); Hong-Sik Yoon, Gyeonggi-do (KR); Shi-Eun Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/375,617

(22) Filed: Mar. 14, 2006

(65) Prior Publication Data

US 2006/0220134 A1 Oct. 5, 2006

(30) Foreign Application Priority Data

Mar. 16, 2005 (KR) .................. 10-2005-0021996

(51) Int. Cl.
*H01L 27/01* (2006.01)
*H01L 27/12* (2006.01)
*H01L 31/0392* (2006.01)
*H01L 29/10* (2006.01)
*H01L 29/76* (2006.01)
*H01L 31/036* (2006.01)
*H01L 31/112* (2006.01)

(52) U.S. Cl. .................. 257/351; 257/67; 257/350; 257/798; 257/331; 257/328; 257/E21.661; 257/393; 257/401

(58) Field of Classification Search .............. 257/296, 257/401, 350, 798, 331, 328, E21.661, 393, 257/67, 351
See application file for complete search history.

(56) References Cited

U.S. PATENT DOCUMENTS 5,241,193 A * 8/1993 Pfiester et al. ............ 257/67

(Continued)

FOREIGN PATENT DOCUMENTS

KR 10-1994-0020571 8/1994

(Continued)

OTHER PUBLICATIONS

Xusheng Wu, Philip C. H. Chan, Shengdong Zhang, Chuguang Feng, and Mansun Chan,"A Three-Dimensional Stacked Fin-CMOS Technology for High-Density ULSI Circuits", Sep. 9, 2005, IEEE Transactions on Electron Devices, vol. 52, 1998-2003.*

(Continued)

*Primary Examiner*—Minsun Oh Harvey
*Assistant Examiner*—Joshua J King
(74) *Attorney, Agent, or Firm*—Myers Bigel Sibley & Sajovec PA

(57) ABSTRACT

Complementary metal oxide semiconductor (CMOS) static random access memory (SRAM) cells include at least a first inverter formed in a fin-shaped pattern of stacked semiconductor regions of opposite conductivity type. In some of these embodiments, the first inverter includes a first conductivity type (e.g., P-type or N-type) MOS load transistor electrically coupled in series with a second conductivity type (e.g., N-type of P-type) MOS driver transistor. The first inverter is arranged so that active regions of the first conductivity type MOS load transistor and the second conductivity type driver transistor are vertically stacked relative to each other within a first portion of a vertical dual-conductivity semiconductor fin structure. This fin structure is surrounded on at least three sides by a wraparound gate electrode, which is configured to modulate conductivity of both the active regions in response to a gate signal.

7 Claims, 12 Drawing Sheets

U.S. PATENT DOCUMENTS

| | | | |
|---|---|---|---|
| 5,347,152 A | 9/1994 | Sundaresan | |
| 5,372,959 A | 12/1994 | Chan | |
| 5,384,731 A | 1/1995 | Kuriyama et al. | |
| 5,604,368 A * | 2/1997 | Taur et al. | 257/348 |
| 6,341,083 B1 * | 1/2002 | Wong | 365/154 |
| 6,413,802 B1 * | 7/2002 | Hu et al. | 438/151 |
| 6,518,112 B2 | 2/2003 | Armacost et al. | |
| 6,856,030 B2 * | 2/2005 | Madurawe | 257/141 |
| 6,924,560 B2 * | 8/2005 | Wang et al. | 257/67 |
| 2001/0028059 A1 * | 10/2001 | Emma et al. | 257/67 |
| 2004/0099885 A1 | 5/2004 | Yeo et al. | |
| 2004/0245577 A1 * | 12/2004 | Bhattacharyya | 257/369 |
| 2005/0167650 A1 * | 8/2005 | Orlowski et al. | 257/16 |
| 2006/0138465 A1 * | 6/2006 | Choi et al. | 257/207 |
| 2006/0202271 A1 * | 9/2006 | Kato | 257/351 |

FOREIGN PATENT DOCUMENTS

KR       1020030060142 A       7/2003

OTHER PUBLICATIONS

C. E. Chen, H. W. Lam, S. D. S. Malhi, and R. F. Pinizzotto, "Stacked CMOS SRAM Cell", Aug. 8, 1983, IEEE Electron Device Letters, vol. EDL-4, No. 8, 272-274.*

Meikei Ieong, Kathryn W. Guarini, Victor Chan, Kerry Bernstein, Rajiv Joshi, Jakub Kedzierski, and Wilfried Haensh, "Three Dimensional CMOS Devices and Integrated Circuits", 2003, IEEE 2003 Custom Integrated Circuits Conference, 207-213.*

Y. Uemoto, E. Fujii, A. Nakamura, and K. Senda, "A High-Performance Stacked-CMOS SRAM Cell by Solid Phase Growth Technique", 1990, IEEE, 1990 Symposium on VLSI Technology, 21-22.*

Office Action, Korean Application No. 10-2005-0021996, Sep. 22, 2006.

* cited by examiner

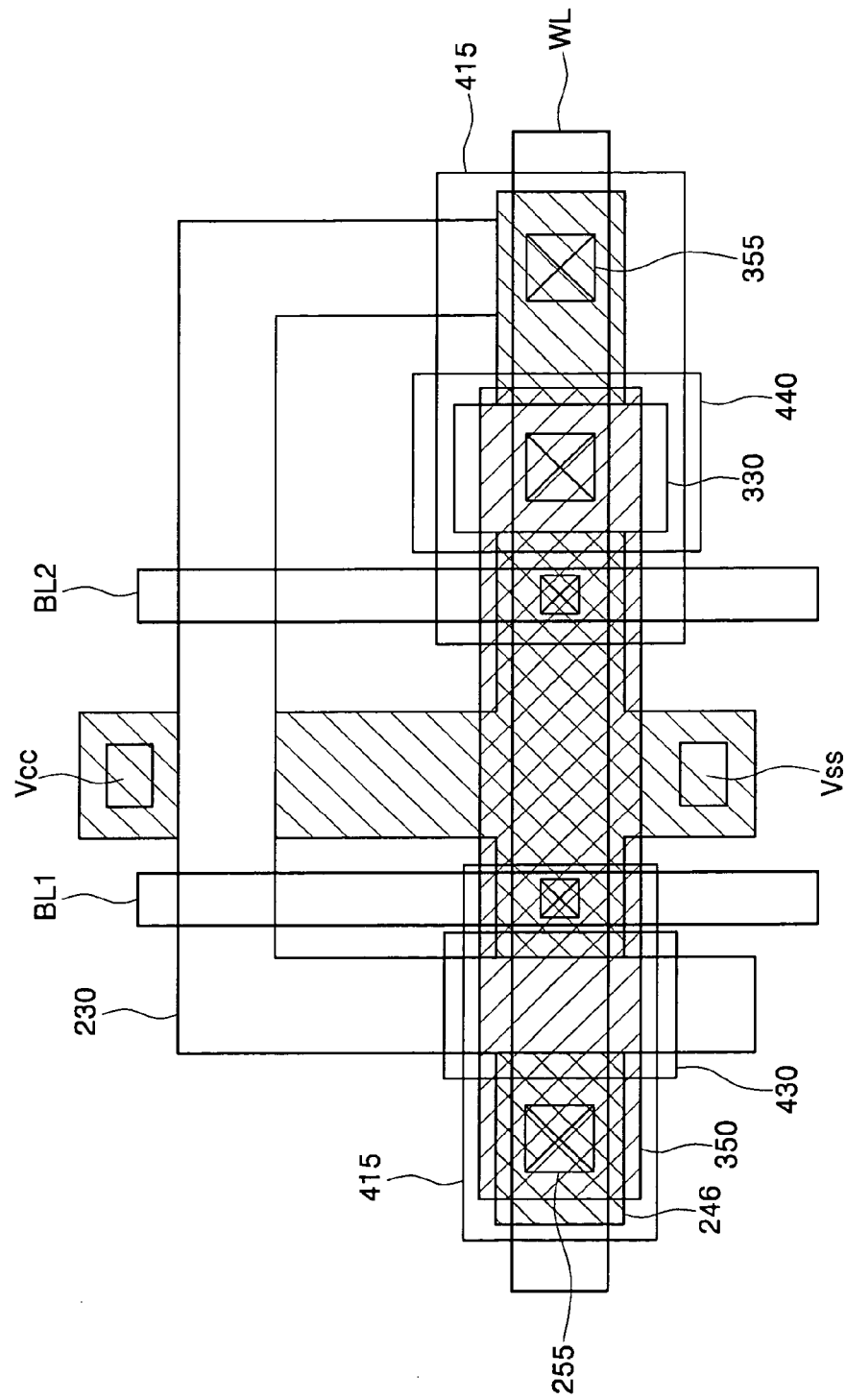

SRAM CELLS HAVING INVERTERS AND ACCESS TRANSISTORS THEREIN WITH VERTICAL FIN-SHAPED ACTIVE REGIONS

REFERENCE TO PRIORITY APPLICATION

This application claims the benefit of Korean Patent Application No. 2005-21996, filed Mar. 16, 2005, the disclosure of which is hereby incorporated herein by reference.

FIELD OF THE INVENTION

The present invention relates to semiconductor memory devices and methods of fabricating the same and, more particularly, to complementary metal oxide semiconductor static random access memory (CMOS SRAM) cells and methods of fabricating the same.

BACKGROUND OF THE INVENTION

A static random access memory (SRAM) has the advantages of low power consumption and fast operating speed compared to a dynamic RAM (DRAM). Accordingly, the SRAM is widely employed in a portable appliance or a cache memory device of a computer. A unit cell of the SRAM is mainly classified into two types. One of them is a high load resistor SRAM cell, which employs a high load resistor as a load device, and the other is a CMOS SRAM cell, which employs a P-channel MOS (PMOS) transistor as a load device. The CMOS SRAM cell is again classified into two types. One of them is a thin film transistor (TFT) SRAM cell which employs a TFT formed on a semiconductor substrate as a load device, and the other is a bulk CMOS SRAM cell which employs a bulk transistor formed in a semiconductor substrate as a load device. The bulk CMOS SRAM cell has high cell stability compared to the TFT SRAM cell and the high load resistor SRAM cell. That is, the bulk CMOS SRAM cell has good low voltage characteristics and low standby current. This is possible because all transistors constituting the bulk CMOS SRAM cell are formed on a single crystalline silicon substrate whereas the TFT is generally fabricated using a polysilicon layer as a body layer, which may have higher leakage characteristics. However, the bulk CMOS SRAM cell has a relatively low integration density compared to the TFT SRAM cell.

Even though the TFT SRAM cell has a higher integration density than the bulk CMOS SRAM cell, the integration density of the TFT SRAM cell is still lower than the integration density of the DRAM cell. Accordingly, in order to implement a highly integrated SRAM device having high reliability, it is typically necessary to design a compact cell having a three-dimensional structure.

An SRAM cell having a three dimensional structure formed using multiple-gate transistors is disclosed in U.S. Patent Publication No. 2004/99885 to Yeo et al., entitled "CMOS SRAM cell configured using multiple-gate transistors." According to Yeo et al., gate electrodes are formed at both sides of silicon bodies facing each other to configure multiple-gate field effect transistors (FETs). The multiple-gate FETs are pull-down transistors or pull-up transistors of the SRAM cell. FIG. 1 illustrates a conventional CMOS SRAM cell. Referring to FIG. 1, the CMOS SRAM cell includes a pair of driver transistors TD1 and TD2, a pair of transfer transistors TA1 and TA2, and a pair of load transistors TL1 and TL2. The driver transistors TD1 and TD2 and the transfer transistors TA1 and TA2 are NMOS (PMOS) transistors and the load transistors TL1 and TL2 are PMOS (NMOS) transistors. A source region of the first driver transistor TD1 is connected to a ground line Vss, and a drain region of the first transfer transistor TA1 is connected to a first bit line BL1. Similarly, a source region of the second driver transistor TD2 is connected to the ground line Vss, and a drain region of the second transfer transistor TA2 is connected to a second bit line BL2.

Source and drain regions of the first load transistor TL1 are connected to a power supply line Vcc and a drain region of the first driver transistor TD1, respectively. Similarly, source and drain regions of the second load transistor TL2 are electrically connected to the power supply line Vcc and a drain region of the second driver transistor TD2, respectively. The drain region of the first load transistor TL1, the drain region of the first driver transistor TD1, and the source region of the first transfer transistor TA1 are connected together at a first node N1. In addition, the drain region of the second load transistor TL2, the drain region of the second driver transistor TD2, and the source region of the second transfer transistor TA2 are connected together at a second node N2. The first and second nodes N1 and N2 act as storage nodes of the SRAM cell. A gate electrode of the first driver transistor TD1 and a gate electrode of the first load transistor TL1 are connected to the second node N2, and a gate electrode of the second driver transistor TD2 and a gate electrode of the second load transistor TL2 are connected to the first node N1. In addition, gate electrodes of the first and second transfer transistors TA1 and TA2 are connected to a word line WL.

The drain region of the first load transistor TL1 is electrically connected to the drain region of the first driver transistor TD1 via the first node N1. Similarly, the drain region of the second load transistor TL2 is electrically connected to the drain region of the second driver transistor TD2 via the second node N2. Accordingly, the first load transistor TL1 and the first driver transistor TD1 are connected in series to form a first inverter. Similarly, the second load transistor TL2 and the second driver transistor TD2 are connected in series to form a second inverter. Accordingly, the first and second inverters are cross-coupled to form one latch circuit.

SUMMARY OF THE INVENTION

Complementary metal oxide semiconductor (CMOS) static random access memory (SRAM) cells according to embodiments of the present invention include at least a first inverter formed in a fin-shaped pattern of stacked semiconductor regions of opposite conductivity type. In some of these embodiments, the first inverter includes a first conductivity type (e.g., P-type or N-type) MOS load transistor electrically coupled in series with a second conductivity type (e.g., N-type of P-type) MOS driver transistor. The first inverter is arranged so that active regions of the first conductivity type MOS load transistor and the second conductivity type driver transistor are vertically stacked relative to each other within a first portion of a vertical dual-conductivity semiconductor fin structure. This fin structure is surrounded on at least three sides by a wraparound gate electrode, which is configured to modulate conductivity of both the active regions in response to a gate signal.

In some of these embodiments, the vertical dual-conductivity semiconductor fin structure includes a first single crystal semiconductor pattern, a second semiconductor pattern extending on the first single crystal semiconductor pattern and an insulating layer extending between the first single crystal semiconductor pattern and the second semiconductor pattern. In some of these embodiments, the second semiconductor pattern is a single crystal semiconductor pattern or a polysilicon semiconductor pattern. According to further aspects of these embodiments, the active region of the first conductivity type MOS load transistor extends within the second semiconductor pattern and the active region of the second conductivity type driver transistor extends within the first single crystal semiconductor pattern. The second semiconductor pattern may be P-type (or N-type) and the first single crystal semiconductor pattern may be N-type (or P-type).

The CMOS SRAM cell according to embodiments of the invention also includes a pair of access (i.e., transfer) transistors, which are responsive to a word line signal. One of these access transistors has a gate terminal responsive to a word line signal, a first current carrying terminal (e.g., source or drain) electrically connected to a first bit line and a second current carrying terminal (e.g., drain or source) electrically connected to drain terminals of the first conductivity type MOS load transistor and the second conductivity type MOS driver transistor. In some of these embodiments, the access transistors may be thin-film transistors (TFT), however, in other embodiments the access transistors may have active regions formed within single crystal semiconductor material located within a vertical fin-shaped structure. In particular, an active region of the access transistor may be formed within a second portion of the vertical dual-conductivity semiconductor fin structure.

Still further embodiments of the present invention include methods of forming CMOS SRAM cells, as described more fully hereinbelow.

BRIEF DESCRIPTION OF THE DRAWINGS

FIG. 3B is a layout of an SRAM cell in accordance with another exemplary embodiment of the present invention.

DETAILED DESCRIPTION OF THE INVENTION

Figure 1:
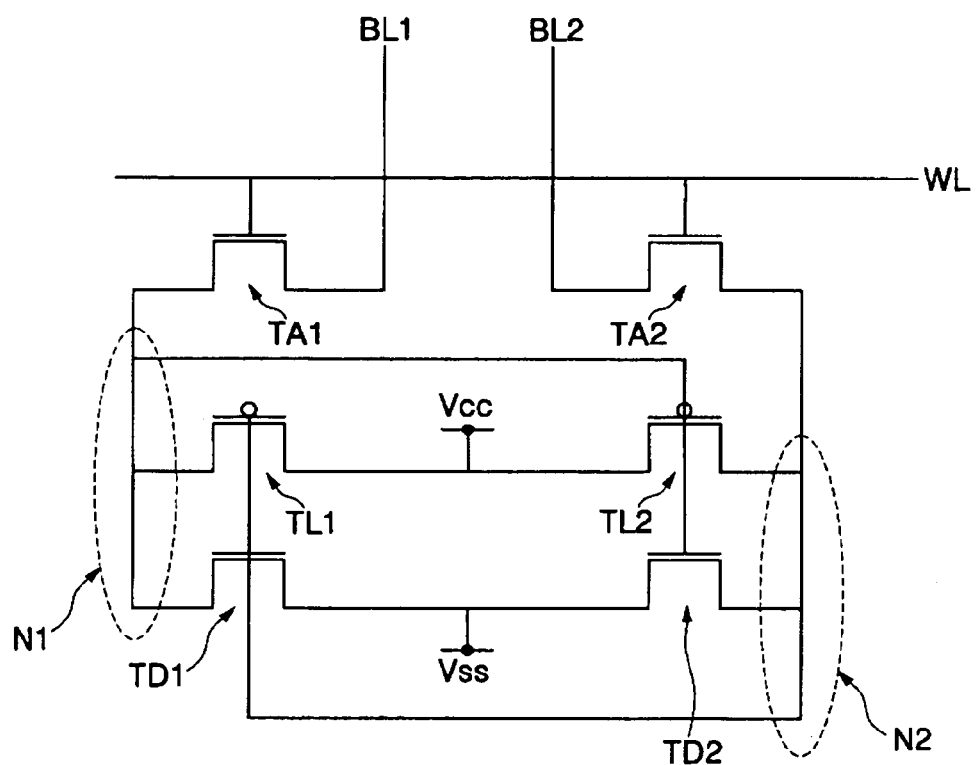
FIG. 1 is an equivalent circuit diagram of a conventional CMOS SRAM cell.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. In addition, when a layer is described to be formed on other layer or on a substrate, which means that the layer may be formed on the other layer or on the substrate, or a third layer may be interposed between the layer and the other layer or the substrate. Like numbers refer to like elements throughout the specification.

Figure 2:
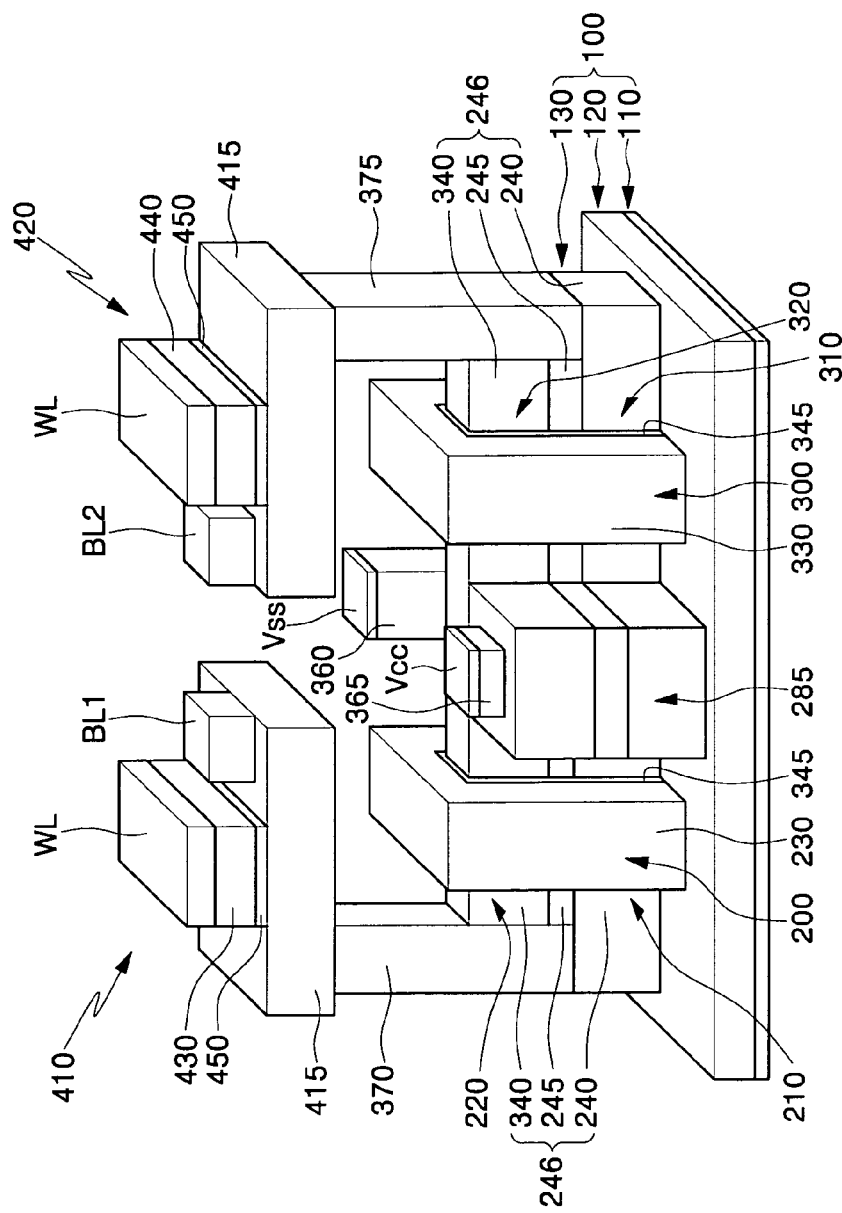
FIG. 2 is a perspective view of an SRAM cell in accordance with an exemplary embodiment of the present invention.
Figure 3A:
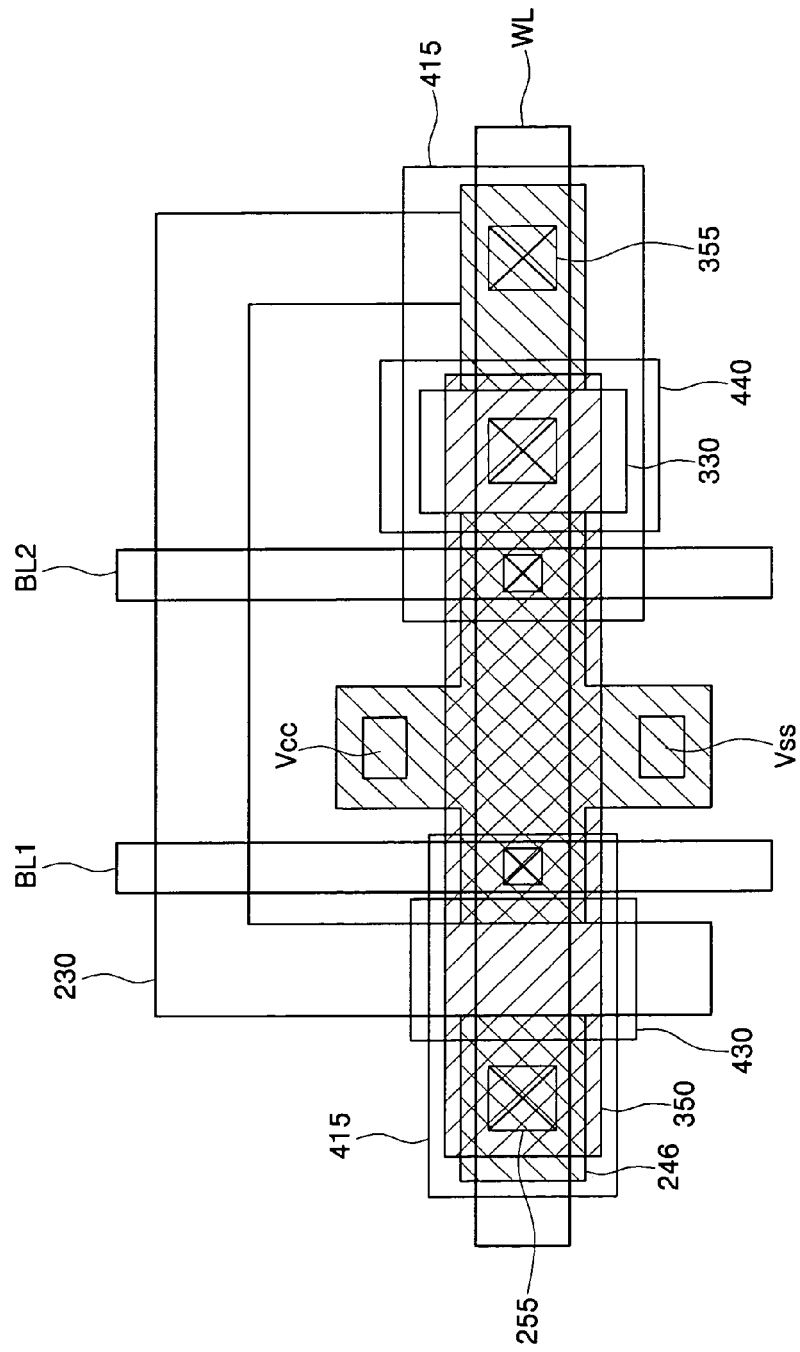
FIG. 3A is a layout of an SRAM cell in accordance with an exemplary embodiment of the present invention.

Referring to FIGS. 2 and 3A, a CMOS SRAM cell according to an embodiment of the present invention employs multiple-gate transistors. In the SRAM cell, first and second multiple-gate FETs 200 and 300 are formed on the semiconductor substrate 100 and are spaced apart from each other. The semiconductor substrate 100 may be a silicon-on-insulator (SOI) substrate. The first multiple-gate FET 200 may have a first N-channel driver transistor 210 and a first P-channel load transistor 220 which are sequentially stacked. Alternatively, the first multiple-gate FET 200 may have a first P-channel driver transistor and a first N-channel load transistor, which are sequentially stacked. Similarly, the second multiple-gate FET 300 may have a second N-channel driver transistor 310 and a second P-channel load transistor 320 which are sequentially stacked. Alternatively, the second multiple-gate FET 300 may have a second P-channel driver transistor and a second N-channel load transistor, which are sequentially stacked. The first N-channel driver transistor 210 and the first P-channel load transistor 220 may have a first insulated common gate electrode 230. Similarly, the second N-channel driver transistor 310 and the second P-channel load transistor 320 may have a second insulated common gate electrode 330.

The first and second multiple-gate FETs 200 and 300 may use first and second fin bodies 240 and 340, which extend above the semiconductor substrate 100 and sequentially stacked. A body isolation layer 245 may be interposed between the first and second fin bodies 240 and 340. As a result, the first fin body 240, the body isolation layer 245, and the second fin body 340 which are sequentially stacked may constitute fin body layers 246 of the first and second multiple-gate FETs 200 and 300. The body isolation layer 245 may be a silicon oxide layer or a silicon nitride layer. The first and second fin bodies 240 and 340 may be an N-channel region and a P-channel region, respectively. The first and second fin bodies 240 and 340 may be single crystalline silicon layers. Alternatively, the first fin body 240 may be a single crystalline silicon layer and the second fin body 340 may be a polysilicon layer. The insulated common gate electrodes 230 and 330 may surround a top surface and sidewalls of the fin body layer 246. The insulated common gate electrodes 230 and 330 may be polysilicon layers. A gate insulating layer 345 may be interposed between the insulated common gate electrodes 230 and 330 and the sidewalls or top surface of the fin body layer 246. The gate insulating layer 345 may be a silicon oxide layer.

A common source region of the first and second N-channel driver transistors 210 and 310 may be formed in the first fin body 240 between the first and second insulated common gate electrodes 230 and 330. Similarly, a common source region of the first and second P-channel driver transistors 220 and 320 may be formed in the second fin body 340 between the first and second insulated common gate electrodes 230 and 330. A ground line Vss may be electrically connected to the common source region of the first and second N-channel driver transistors 210 and 310. In this case, the ground line Vss may be a common ground line of SRAM cells adjacent to each other. A power supply line Vcc may be electrically connected to the common source region of the first and second P-channel load transistors 220 and 320.

In addition, a drain region of the first N-channel driver transistor 210 may be formed in the first fin body 240 to face the common source region of the first N-channel driver transistor 210. Consequently, the first insulated common gate electrode 230 may be disposed between the drain region and the common source region of the first N-channel driver transistor 210. Similarly, a drain region of the first P-channel load transistor 220 may be formed in the second fin body 340 to face the common source region of the first P-channel load transistor 220. As a result, the first insulated common gate electrode 230 may be disposed between the drain region and the common source region of the first P-channel load transistor 220. A drain region of the second N-channel driver transistor 310 may be formed in the first fin body 240 to face the common source region of the second N-channel driver transistor 310. Consequently, the second insulated common gate electrode 330 may be disposed between the drain region and the common source region of the second N-channel driver transistor 310. Similarly, a drain region of the second P-channel load transistor 320 may be formed in the second fin body 340 to face the common source region of the second P-channel load transistor 320. Consequently, the second insulated common gate electrode 330 may be disposed between the drain region and the common source region of the second P-channel load transistor 320.

Referring to FIGS. 2 and 3A, a first interconnection may be disposed which electrically connects the first insulated common gate electrode 230 of the first N-channel driver transistor 210 and the first P-channel load transistor 220 to the drain regions of the second N-channel driver transistor 310 and the second P-channel load transistor 320. The first interconnection may be a metal interconnection. In addition, the first interconnection may extend from the first insulated common gate electrode 230. In this case, the first interconnection may surround the power supply line when seen from a plan view. That is, when seen from the plan view, the power supply line Vcc may be disposed between the first and second fin bodies 240 and 340 and the first interconnection. Referring to FIG. 3B, instead of the configuration of FIG. 3A, the first interconnection may be disposed between the first and second fin bodies 240 and 340 and the power supply line Vcc when seen from the plan view. Similarly, a second interconnection may be disposed which electrically connects the second insulated common gate electrode 330 of the second N-channel driver transistor 310 and the second P-channel load transistor 320 to the drain regions of the first N-channel driver transistor 210 and the first P-channel load transistor 220. The second interconnection may be a metal interconnection or the second insulated common gate electrode.

Accordingly, the first N-channel driver transistor 210 and the first P-channel load transistor 220 are connected in series to each other to form a first inverter and the second N-channel driver transistor 310 and the second P-channel load transistor 320 are connected in series to each other to form a second inverter. The first and second inverters are cross-coupled to each other thereby forming one latch circuit.

First and second N-channel transfer transistors 410 and 420 may be disposed above the first and second multiple-gate FETs 200 and 300, respectively. The first and second N-channel transfer transistors 410 and 420 may be formed as thin-film transistors (TFTs). That is, the first and second N-channel transfer transistors 410 and 420 may have poly-silicon body layers 415. The first and second N-channel transfer transistors 410 and 420 have active regions (not shown) in the polysilicon body layers 415. The active regions are defined by isolation layers (not shown). Each of the first and second N-channel transfer transistors 410 and 420 has source/drain regions (not shown) spaced apart from each other in the active region. The first and second N-channel transfer transistors 410 and 420 have first and second transfer gate electrodes 430 and 440 crossing over the active regions, respectively. Consequently, the first and second transfer gate electrodes 430 and 440 are disposed to cross the active regions between the source/drain regions of the first and second N-channel transfer transistors 410 and 420, respectively.

Referring still to FIGS. 2 an 3A, a word line WL may be formed which crosses the active regions of the first and second N-channel transfer transistors 410 and 420 and is electrically connected to the first and second transfer gate electrodes 430 and 440. Further, the first and second bit lines BL1 and BL2, which are electrically connected to the drain regions of the first and second N-channel transfer transistors 410 and 420, may be formed above the first and second N-channel transfer transistors 410 and 420, respectively. Drain regions of the first N-channel driver transistor 210 and the first P-channel load transistor 220 are electrically connected to the source region of the first N-channel transfer transistor 410 via a first contact plug 370 (see 255 in FIG. 3A). Similarly, drain regions of the second N-channel driver transistor 310 and the second P-channel load transistor 320 are electrically connected to the source region of the second N-channel transfer transistor 420 via a second contact plug 375 (see 355 in FIG. 3A).

Figure 4:
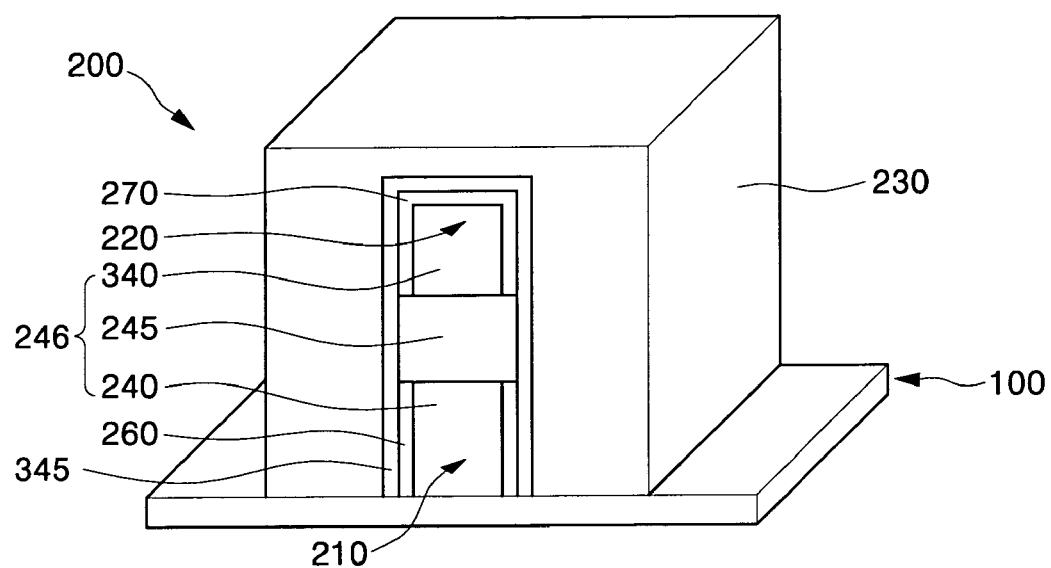
FIG. 4 is a view illustrating channel regions of a multiple-gate FET employed by an SRAM cell in accordance with an exemplary embodiment of the present invention.

The SRAM cell according to an embodiment of the present invention uses the multiple-gate FETs as described above. That is, channel regions are formed at a top region of the second fin body or side regions of the first and second fin bodies sequentially stacked on the semiconductor substrate. FIG. 4 is a view of channel regions of the multiple-gate FET employed by the SRAM cell in accordance with the present invention. Referring to FIG. 4, on the assumption that an N-channel transistor 210 and a P-channel transistor 220 are sequentially stacked on a semiconductor substrate 100, first and second fin bodies 240 and 340 are sequentially disposed on the semiconductor substrate 100. A body isolation layer 245 is interposed between the first and second fin bodies 240 and 340. Consequently, the first fin body 240, the body isolation layer 245, and the second fin body 340 which are sequentially stacked on the semiconductor substrate 100 constitute a fin body layer 246. An insulated common gate electrode 230, which covers a top surface and sidewalls of the fin body layer 246, is formed. Source/drain regions (not shown) of the N-channel transistor 210 are spaced apart from each other in the first fin body 240. Consequently, the insulated common gate electrode 230 is disposed between the source/drain regions of the N-channel transistor 210. Similarly, source/drain regions (not shown) of the P-channel transistor 220 are spaced apart from each other in the second fin body 340. Consequently, the insulated common gate electrode 230 is formed between the source/drain regions of the P-channel transistor 220. A gate insulating layer 345 may be interposed between sidewalls of the fin body layer 246 and the insulated common gate electrode 230 or between the top surface of the fin body layer 246 and the insulated common gate electrode 230. In this case, N-channel regions 260 may be disposed in the first fin body 240. Similarly, P-channel regions 270 may be disposed in the second fin body.

A current between a source and a drain of a transistor (hereinafter, it will be referred to as drain current $I_{ds}$), which denotes driving capability, may be expressed by the below Equation (1):

$$I_{ds}=(W/L)uC_{ox}\{V_{gs}-V_{th}-(V_{ds}/2)\}V_{ds} \quad (1)$$

where W denotes a width of the gate, L denotes an effective length of the gate, u denotes electron average mobility, $C_{ox}$ denotes a gate capacitance, $V_{gs}$ denotes a gate voltage, $V_{th}$ denotes a threshold voltage, and $V_{ds}$ denotes a drain voltage.

Referring to Equation (1), it can be seen that the drain current $I_{ds}$ is directly proportional to the width W of the gate. Accordingly, because the SRAM cell employing the multiple-gate FETs may be configured by adjusting the height dimension of the multiple-gate FET, the drain current $I_{ds}$ may be adjusted for a given application by varying height instead of width.

Figure 5:
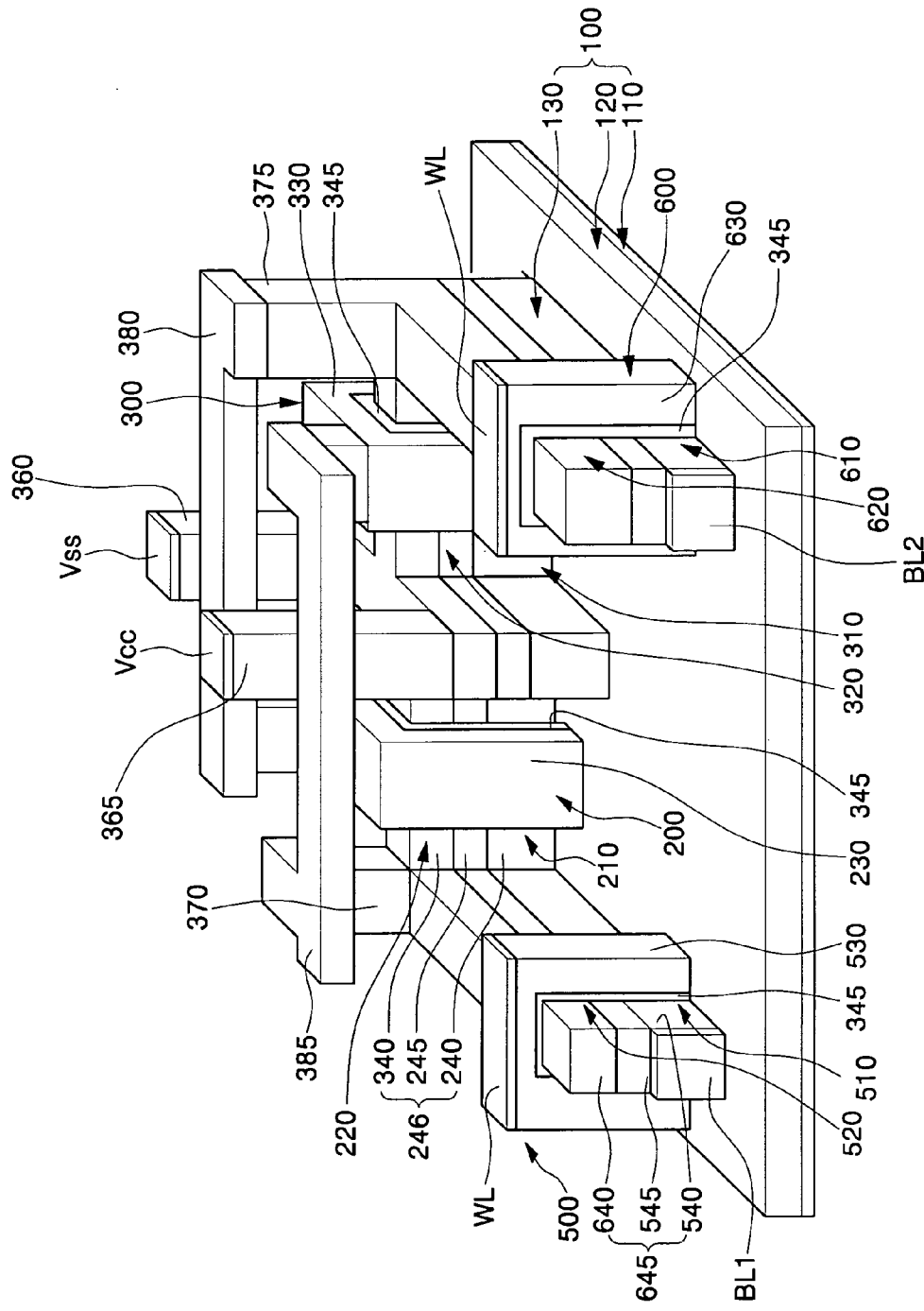
FIG. 5 is a perspective view of an SRAM cell in accordance with yet another exemplary embodiment of the present invention.

Referring to FIG. 5 another exemplary embodiment of an SRAM cell of the present invention will be described. This SRAM cell includes third and fourth multiple-gate FETs 500 and 600 spaced apart from each other on a semiconductor substrate 100. The third and fourth multiple-gate FETs 500 and 600 may be transfer transistors of the SRAM cell according to the present invention. That is, the first and second transfer transistors according to the above-described embodiment of FIGS. 2-4 may be replaced by transfer transistors to be described in the following embodiment. In this case, arrangement and connection of the first and second multiple-gate FETs 200 and 300 are the same as or similar to the above-described embodiment of FIG. 2 so the description of the transistors. In the above-described embodiment, it has been described that the first and second multiple-gate FETs are configured by the first N-channel driver transistor 210 and the first P-channel load transistor 220 which are sequentially stacked and have the first insulated common gate electrode 230, and the second N-channel driver transistor 310 and the second P-channel load transistor 320 which are sequentially stacked and have the second insulated common gate electrode 330, respectively.

Figure 6:
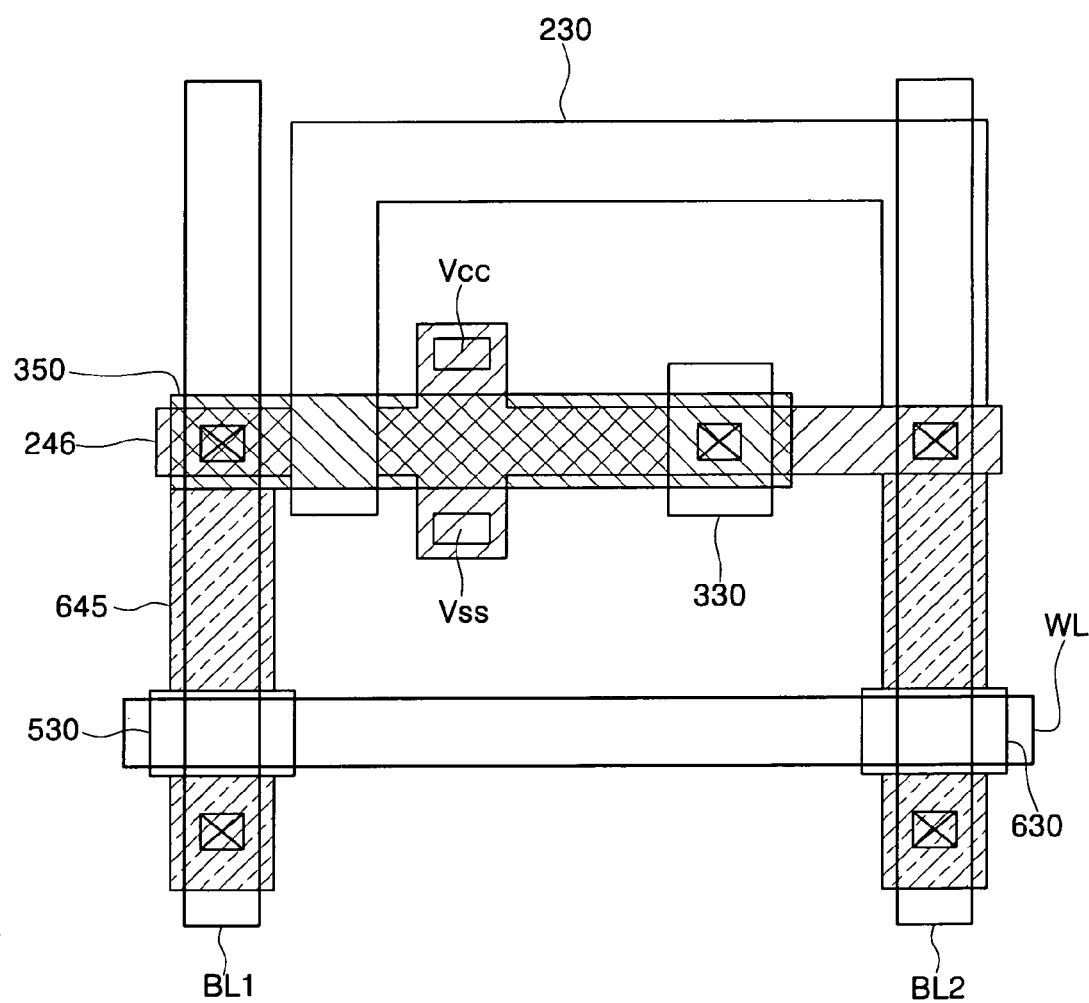
FIG. 6 is the layout of an SRAM cell in accordance with yet another exemplary embodiment of the present invention.

Referring to FIGS. 5 and 6, when the third and fourth multiple-gate FETs 500 and 600 are transfer transistors of the SRAM cell according to the present invention, the third multiple-gate FET 500 may include a third N-channel transfer transistor 510 and a third P-channel transfer transistor 520 which are sequentially stacked. Similarly, the fourth multiple-gate FET 600 may include a fourth N-channel transfer transistor 610 and a fourth P-channel transfer transistor 620 which are sequentially stacked. The third N-channel transfer transistor 510 and the third P-channel transfer transistor 520 may have a third insulated common gate electrode 530. Similarly, the fourth N-channel transfer transistor 610 and the fourth P-channel transfer transistor 620 may have a fourth insulated common gate electrode 630.

Each of the third and fourth multiple-gate FETs 500 and 600 may have additional upper and lower fin bodies 640 and 540, which are sequentially stacked and are protruded from the semiconductor substrate 100. The semiconductor substrate 100 may be an SOI substrate. An additional body isolation layer 545 may be interposed between the additional upper and lower fin bodies 640 and 540. Consequently, the additional lower fin body 540, the additional body isolation layer 545, and the additional upper fin body 640 which are sequentially stacked may constitute an additional fin body layer 645 protruded from the semiconductor substrate 100. The additional fin body layer 645 extends from both ends of the fin body layer 246 of the first and second multiple-gate FETs 200 and 300 so that it is disposed on the semiconductor substrate 100. Similarly, the additional body isolation layer 545 interposed between the additional upper and lower fin bodies 640 and 540 also extends from both ends of the body isolation layer 245 interposed between the fin bodies 240 and 340 of the first and second multiple-gate FETs 200 and 300 so that it is disposed on the semiconductor substrate 100. Consequently, the first and second fin bodies 240 and 340 of the first and second multiple-gate FETs 200 and 300 may have the same conductivity type channel region together with the same material layer as the additional upper and lower fin bodies 640 and 540 of the third and fourth multiple-gate FETs 500 and 600. For example, when the first and second fin bodies 240 and 340 are single crystalline silicon layers, the additional upper and lower fin bodies 640 and 540 may also be single crystalline silicon layers. That is, the third and fourth multiple-gate FETs 500 and 600 may operate as "bulk" transistors.

The third insulated common gate electrode 530 may cover a top surface and sidewalls of the additional fin body layer 645 of the sequentially stacked third multiple-gate FET 500. Source and drain regions of the third N-channel transfer transistor 510, which are spaced apart from each other, are disposed in the additional lower fin body 540. Consequently, the third insulated common gate electrode 530 is disposed between the source and drain regions of the third N-channel transfer transistor 510. Similarly, source and drain regions of the third P-channel transfer transistor 520, which are spaced apart from each other, are disposed in the additional upper fin body 640. Consequently, the third insulated common gate electrode 530 is disposed between the source and drain regions of the third P-channel transfer transistor 520. In this case, the third P-channel transfer transistor 520 may act as a dummy transistor. A gate insulating layer 345 may be interposed between the third insulated common gate electrode 530 and a top surface or sidewalls of the additional fin body layer 645.

Similarly, the fourth insulated common gate electrode 630 may cover a top surface and sidewalls of the additional fin body layer 645 of the fourth multiple-gate FET 600. Source and drain regions of the fourth N-channel transfer transistor 610, which are spaced apart from each other, are disposed in the additional lower fin body 540. Consequently, the fourth insulated common gate electrode 630 is disposed between the source and drain regions of the fourth N-channel transfer transistor 610. Similarly, source and drain regions of the fourth P-channel transfer transistor 620, which are spaced apart from each other, are disposed in the additional upper fin body 640. Consequently, the fourth insulated common gate electrode 630 is disposed between the source and drain regions of the fourth P-channel transfer transistor 620. In this case, the fourth P-channel transfer transistor 620 may act as a dummy transistor. The gate insulating layer 345 may be interposed between the fourth insulated common gate electrode 630 and a top surface or sidewalls of the additional fin body layer 645.

A word line WL, which may cross the additional fin body layer 645 of the third and fourth multiple-gate FETs 500 and 600 as illustrated by FIG. 6, is electrically connected to the third and fourth insulated common gate electrodes 530 and 630. The first and second bit lines BL1 and BL2 may be formed to be electrically connected to the drain regions of the third and fourth N-channel transfer transistors 510 and 610, respectively.

Figure 7A:
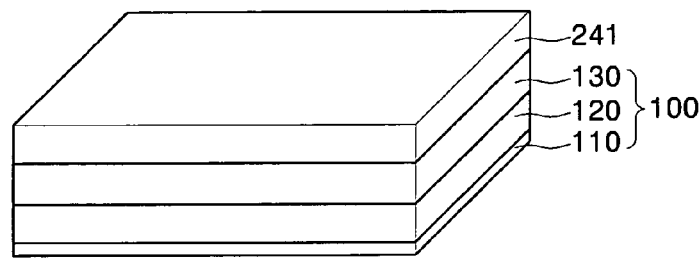
FIGS. 7A to 7G are cross-sectional views illustrating methods of fabricating an SRAM cell in accordance with an exemplary embodiment of the present invention.

Methods of fabricating SRAM cells according to embodiments of the present invention will now be described with respect to FIGS. 7A-7G. Referring to FIG. 7A, a body isolation layer 241 is formed on the semiconductor substrate 100. The semiconductor substrate 100 may be an SOI substrate. Consequently, the semiconductor substrate 100 may be formed of a support substrate 110, a buried insulating layer 120 formed on the support substrate 110, and an active semiconductor layer 130 formed on the buried insulating layer 120. The body isolation layer 241 may be formed of a silicon oxide layer or a silicon nitride layer.

Figure 7B:
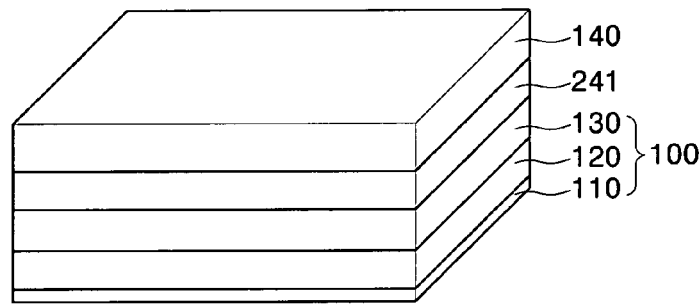

Referring to FIG. 7B, a single crystalline semiconductor layer is formed on the body isolation layer 241. The single crystalline semiconductor layer may be formed using an epitaxial technique. That is, the body isolation layer 241 may be patterned to form a contact hole (not shown) exposing a predetermined region of the semiconductor substrate 100. A single crystalline semiconductor layer may be formed on the entire surface of the semiconductor substrate having the contact hole using the semiconductor substrate exposed by the contact hole (i.e., using the active semiconductor layer 130 as a seed layer). The single crystalline semiconductor layer is planarized to form a single crystalline body layer 140 to a uniform thickness. The single crystalline body layer 140 may be formed of a single crystalline silicon layer. In this case, channel ions having conductivity types different from each other may be implanted into the active semiconductor layer 130 and the single crystalline body layer 140, respectively.

Figure 7C:
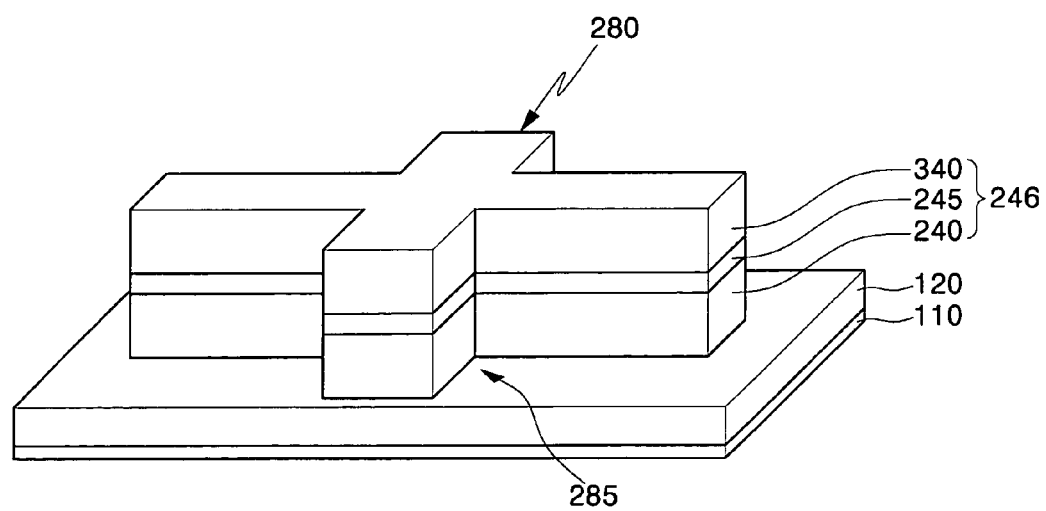

Referring to FIG. 7C, the single crystalline body layer 140, the body isolation layer 241, and the semiconductor substrate 100 are selectively etched to form a fin body pattern 246 where a lower body layer pattern 240, a body isolation layer pattern 245, and an upper body layer pattern 340 are sequentially stacked on the semiconductor substrate. In addition, first and second extensions 280 and 285 may be formed which cross the fin body pattern 246 and extend toward both sides from a center part of the fin body pattern 246. The first and second extensions 280 and 285 may also have the same material layers and stacking structure as the lower body layer pattern, the body isolation layer pattern, and the upper body layer pattern which are sequentially stacked on the semiconductor substrate.

Figure 7D:
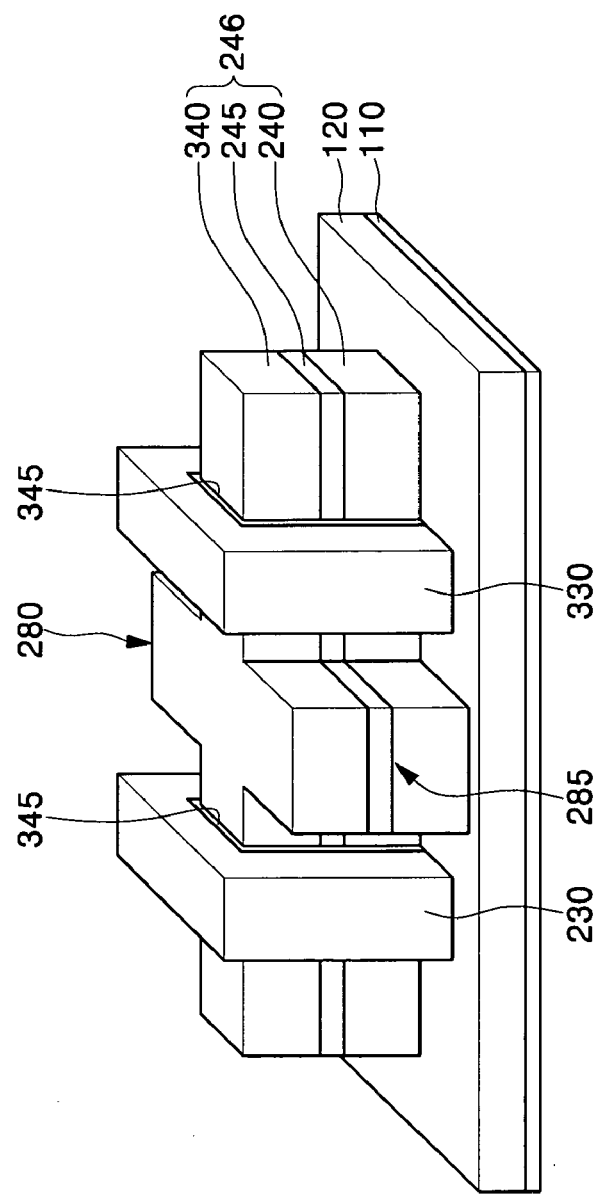

Referring to FIG. 7D, a conductive layer is formed on the entire surface of the semiconductor substrate having the fin body pattern 246. When the first and second extensions 280 and 285 are formed, the conductive layer is formed on the entire surface of the semiconductor substrate including the first and second extensions 280 and 285. The conductive layer may be formed of a polysilicon layer. The conductive layer is patterned to form first and second insulated common gate electrodes 230 and 330 which surround the fin body pattern 246 and are spaced apart from each other. Consequently, the first and second extensions 280 and 285 may be formed between the first and second insulated common gate electrodes 230 and 330. A gate insulating layer 345 may be formed between both sidewalls of the fin body pattern 246 and the first and second insulated common gate electrodes 230 and 330. In addition, the gate insulating layer 345 may be formed between a top surface of the fin body pattern 246 and the first and second insulated common gate electrodes 230 and 330. The gate insulating layer 345 may be formed of a silicon oxide layer before the conductive layer is formed.

In addition, impurity ions of a first conductivity type are implanted into the upper body layer pattern 340 using the first insulated common gate electrode 230 as an ion implantation mask to form a pair of first upper source and drain regions spaced apart from each other. Consequently, the first insulated common gate electrode 230 may be formed between the pair of first upper source and drain regions. Similarly, impurity ions of a second conductivity type different from the first conductivity type are implanted into the lower body layer pattern 240 using the first insulated common gate electrode 230 as an ion implantation mask to form a pair of first lower source/drain regions spaced apart from each other. Consequently, the first insulated common gate electrode 230 may be formed between the pair of first lower source and drain regions. Accordingly, when the first upper source and drain regions are P-type and the first lower source and drain regions are N-type, an N-channel driver transistor and a P-channel load transistor may be sequentially formed on the semiconductor substrate and have the first insulated common gate electrode 230.

Similarly, impurity ions of a first conductivity type are implanted into the upper body layer pattern 340 using the second insulated common gate electrode 330 as an ion implantation mask to form a pair of second upper source and drain regions spaced apart from each other. Consequently, the second insulated common gate electrode 330 may be formed between the pair of second upper source and drain regions. Likewise, impurity ions of a second conductivity type different from the first conductivity type are implanted into the lower body layer pattern 240 using the second insulated common gate electrode 330 as an ion implantation mask to form a pair of second lower source and drain regions spaced apart from each other. Consequently, the second insulated common gate electrode 330 may be formed between the pair of second lower source and drain regions. Accordingly, when the second upper source and drain regions are P-type and the second lower source and drain regions are N-type, an N-channel driver transistor and a P-channel load transistor may be sequentially formed on the semiconductor substrate and have the second insulated common gate electrode 330.

When the first upper and lower source and drain regions and the second upper and lower source and drain regions are formed, drain regions of the first and second insulated common gate electrodes 230 and 330 may be formed at both ends of the fin body pattern 246. In this case, the first insulated common gate electrode 230 may extend to make its one end connected to the drain region associated with the second insulated common gate electrode 330. At the same time, a metal interconnection connected to the second insulated common gate electrode 330 may be formed to make its one end connected to the drain region associated with the first insulated common gate electrode 230.

When the above-described fabrication method is employed, the first upper and lower source regions or the second upper and lower source regions may be formed in the fin body pattern 246 between the first and second insulated common gate electrodes 230 and 330. Accordingly, the first upper and lower source regions or the second upper and lower source regions may act as common source regions of the first and second common gate electrodes 230 and 330. Alternatively, the first and second extensions 280 and 285 of the fin body pattern 246 may be formed in the common source region of the first and second common gate electrodes 230 and 330.

Figure 7E:
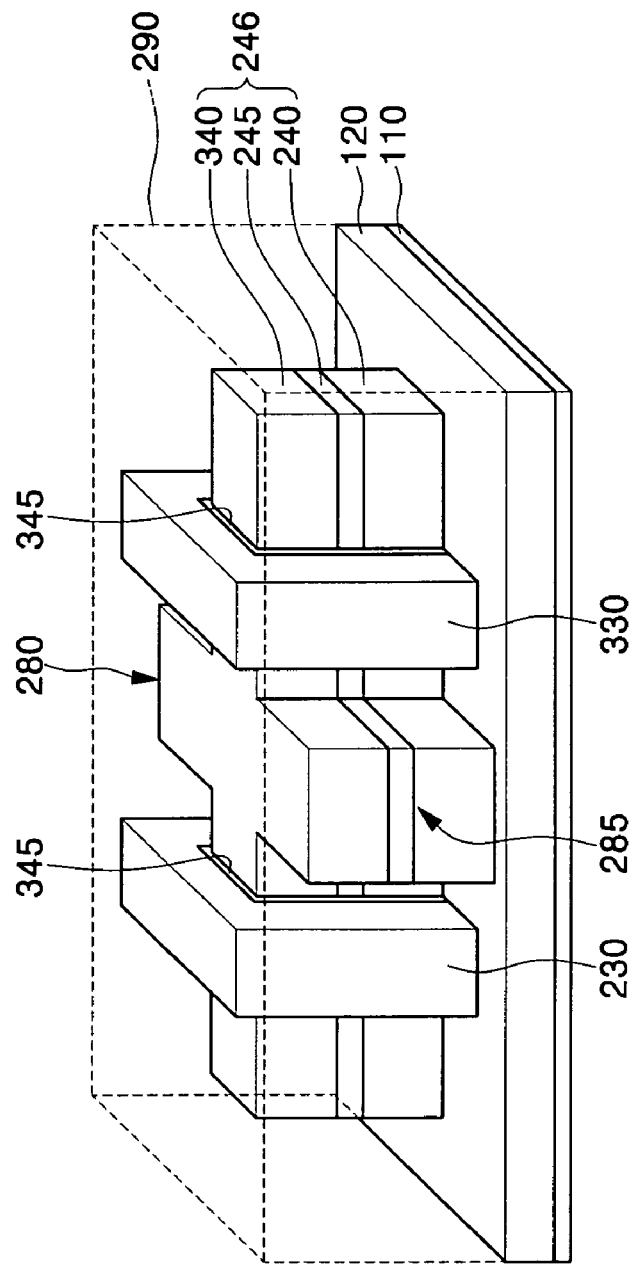

Referring to FIG. 7E, a first interlayer-insulating layer 290 (see dotted lines) is formed on the entire surface of the semiconductor substrate including the fin body pattern 246, the first and second insulated common gates 230 and 330 surrounding the fin body pattern 246, and the first and second upper and lower source and drain regions formed in the fin body pattern 246 at both sides of each of the first and second insulated common gate electrodes 230 and 330. In this case, when the first and second extensions 280 and 285 of the fin body pattern 246 are formed on the semiconductor substrate, the first interlayer-insulating layer 290 may be formed on the entire surface of the semiconductor substrate including the first and second extensions 280 and 285.

Figure 7F:
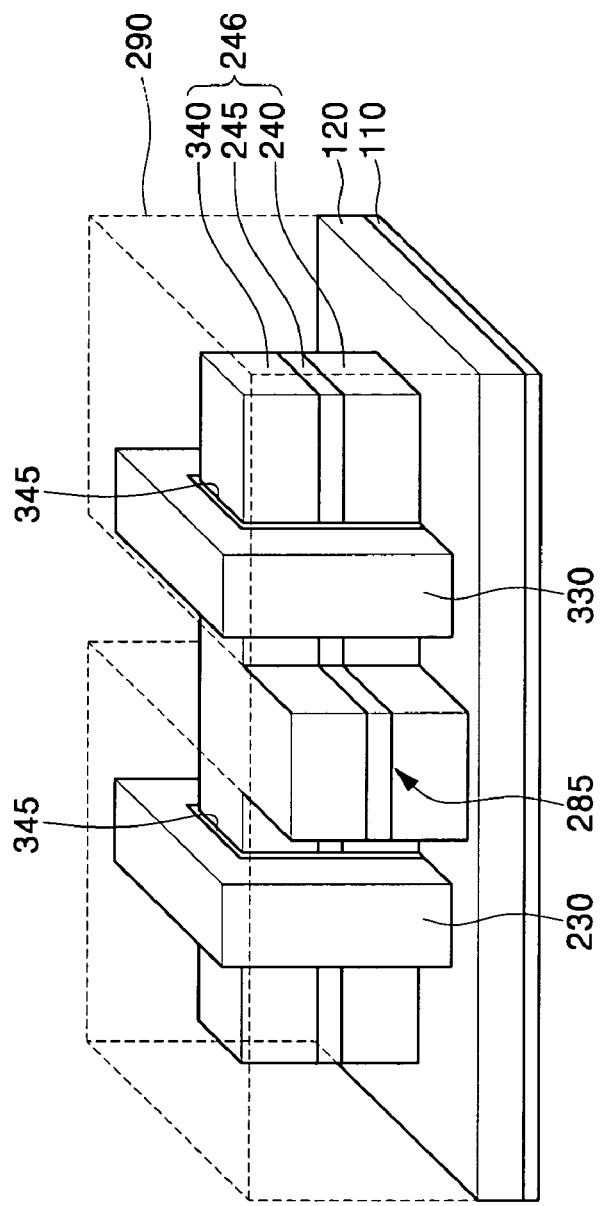

Referring to FIG. 7F, selective etching processes may be performed to expose a lower body layer pattern of the first extension 280 and an upper body layer pattern of the second extension 285.

Figure 7G:
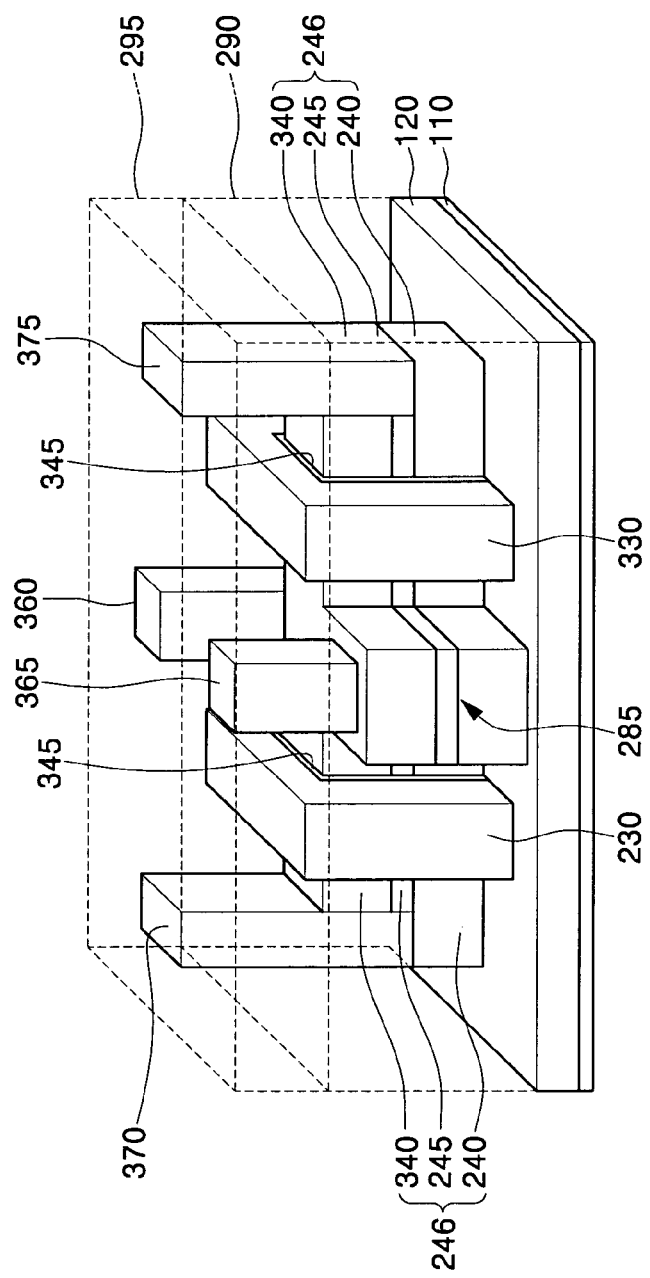

Referring to FIG. 7G, a second interlayer-insulating layer 295 (see dotted lines) is formed on the entire surface of the semiconductor substrate after the lower body layer pattern of the first extension 280 and the upper body layer pattern of the second extension 285 are exposed. A first contact hole is formed to expose the lower body layer pattern of the first extension 280 using photoresist and etching techniques. At the same time, a second contact hole is formed to expose the upper body layer pattern of the second extension 285 using photoresist and etching techniques. In addition, photoresist and etching techniques are employed to form third and fourth contact holes at both ends of the fin body pattern 246, which expose a top surface of the lower body layer pattern 240 and a side surface of the upper body layer pattern 340. A conductive layer is formed on the entire surface of the semiconductor substrate where the first and second contact holes and the third and fourth contact holes are formed. The conductive layer is then planarized to form first and second contact plugs 360 and 365 and third and fourth contact plugs 370 and 375. Consequently, one end of the first contact plug 360 may be electrically connected to the top surface of the lower body layer pattern 240 of the first extension 280. Similarly, one end of the second contact plug 365 may be electrically connected to the top surface of the upper body layer pattern 340 of the second extension 285. In addition, one end of each of the third and fourth contact plugs 370 and 375 may be electrically connected to the top surface of the lower body layer pattern 240 and the side surface of the upper body layer pattern 340 which are formed at both ends of the fin body pattern 246.

Instead of forming the first and second contact plugs 360 and 365 on the lower body layer pattern 240 and the upper body layer pattern 340 of the first and second extensions 280 and 285, the first and second contact plugs may be formed on the lower body layer pattern 240 and the upper body layer pattern 340 of the fin body pattern 246 formed between the first and second insulated common gate electrodes 230 and 330. In this case, the formation of the first and second extensions on the semiconductor substrate may be skipped.

Referring again to FIGS. 2 and 3A, a pair of TFTs 410 and 420, which are spaced apart from each other, are formed on the semiconductor substrate where the fin body pattern 246, the first and second insulated common gate electrodes 230 and 330 surrounding the fin body pattern 246, the first and second upper and lower source and drain regions formed in the fin body pattern 246 at both sides of the first and second insulated common gate electrodes 230 and 330, the first and second contact plugs 360 and 365, the third and fourth contact plugs 370 and 375, and the first and second interlayer-insulating layers (not shown) are formed. That is, the first TFT 410 may be formed on the first insulated common gate electrode 230, and the second TFT 420 may be formed on the second insulated common gate electrode 330. The first and second TFTs 410 and 420 may be fabricated by the following fabrication method. The first and second TFTs 410 and 420 may be used as transfer (i.e., access) transistors of the SRAM cell according to the present invention. Referring to FIGS. 2 and 3A, a polysilicon layer is formed on the entire surface of the semiconductor substrate where the fin body pattern 246, the first and second insulated common gate electrodes 230 and 330 surrounding the fin body pattern 246, the first and second upper and lower source/drain regions formed in the fin body pattern 246 at both sides of the first and second insulated common gate electrodes 230 and 330, the first and second contact plugs 360 and 365, the third and fourth contact plugs 370 and 375, and the first and second interlayer-insulating layers (not shown) are formed. The polysilicon layer is patterned to form a pair of polysilicon bodies 415 spaced apart from each other. A conductive layer is formed on the entire surface of the semiconductor substrate having the polysilicon bodies 415. The conductive layer is patterned to form transfer gate electrodes 430 and 440 of the first and second TFTs on the polysilicon bodies 415. Impurity ions of the second conductivity type are implanted using the transfer gate electrodes 430 and 440 of the first and second TFTs as ion implantation masks to form a pair of source/drain regions spaced apart from each other in the polysilicon bodies 415. Consequently, a gate electrode 430 of the first TFT is formed on an active region (not shown) between the pair of source/drain regions, and a transfer gate electrode 440 of the second TFT is formed on an active region (not shown) between another pair of source/drain regions. A gate insulating layer 450 may be formed between the polysilicon bodies 415 and the transfer gate electrodes 430 and 440 of the first and second TFTs 410 and 420. When the impurity ions of the second conductivity type are N-types, the first and second TFTs 410 and 420 may be used as N-channel transfer transistors. In addition, a word line WL may be formed which crosses the polysilicon bodies 415 and is electrically connected to the transfer gate electrodes 430 and 440 of the first and second TFTs 410 and 420. In addition, first and second bit lines BL1 and BL2 may be formed which are electrically connected to drain regions of the first and second TFTs 410 and 420, respectively.

In addition, one end of the third contact plug 370 may be electrically connected to the drain region of the first insulated common gate electrode 230, and the other end may be electrically connected to the source region of the first TFT 410. Similarly, one end of the fourth contact plug 375 may be electrically connected to the drain region of the second insulated common gate electrode 330, and the other end may be electrically connected to the source region of the second TFT 420. One end of the first contact plug 360 may be electrically connected to a top surface of the lower body layer pattern 240 between the first and second insulated common gate electrodes 230 and 330, and the other end may be electrically connected to a ground line Vss. Similarly, one end of the second contact plug 365 may be electrically connected to a top surface of the upper body layer pattern 340 between the first and second insulated common gate electrodes 230 and 330, and the other end may be electrically connected to a power supply line Vcc.

Hereinafter, another method of fabricating transfer transistors of the SRAM cell according to the present invention will be described. As described above, the transfer transistors of the SRAM cell may use TFTs, but the following description is related to a method fabricating transfer transistors as "bulk" transistors.

Methods of fabricating a fin body pattern, first and second common gate electrodes and source/drain regions, third and fourth contact plugs, and first and second contact plugs are the same as or similar to those described above in the SRAM cell of the present invention, so their descriptions will be skipped. Instead, subsequent processes after the process of fabricating the SRAM cell structure described with reference to FIG. 7F will be described below.

Referring to FIGS. 5 and 6, a pair of additional fin body patterns 645 may be formed at the time of forming a fin body pattern where a lower body layer pattern, a body isolation layer pattern, and an upper body layer pattern are sequentially stacked. The pair of additional fin body patterns 645 are spaced apart from each other. That is, additional fin body patterns 645 may be formed, extending from both ends of the fin body pattern 246. The additional fin body patterns 645 may be formed to cross both ends of the fin body patterns 246. Each of the pair of additional fin body patterns 645 may be formed such that an additional lower body layer pattern 540, an additional body isolation layer pattern 545, and an additional upper body layer pattern 640 are sequentially stacked. The additional upper and lower body patterns 640 and 540 may be formed of the same material layers as the above-described upper and lower body layer patterns. For example, the additional upper and lower body patterns 640 and 540 may be formed of single crystalline silicon layers.

When the first and second insulated common gate electrodes 230 and 330 surrounding the fin body patterns 246 are formed, third and fourth insulated common gate electrodes 530 and 630 may be formed to surround the pair of additional fin body patterns 645, respectively. That is, the third and fourth insulated common gate electrodes 530 and 630 may surround top surfaces and sidewalls of the pair of additional fin body patterns 645. A gate insulating layer 345 may be formed between the pair of additional fin body patterns 645 and the third and fourth common gate electrodes 530 and 630.

Impurity ions of a first conductivity type may be implanted using the third insulated common gate electrode 530 as an ion implantation mask to form a pair of third upper source/drain regions spaced apart from each other in one additional fin body pattern of the pair of additional fin body patterns 645. That is, a pair of third upper source/drain regions spaced apart from each other may be formed in the additional upper body layer pattern 640 of the one additional fin body pattern. Consequently, the third insulated common gate electrode 530 may be formed between the third upper source/drain regions formed in the additional upper body layer pattern 640 of the one additional fin body pattern 645. Similarly, Impurity ions of a second conductivity type different from the first conductivity type may be implanted using the third insulated common gate electrode 530 as an ion implantation mask to form a pair of third lower source/drain regions spaced apart from each other in one additional fin body pattern of the pair of additional fin body patterns 645. That is, a pair of third lower source/drain regions spaced apart from each other may be formed in the additional lower body layer pattern 540 of the one additional fin body pattern. Consequently, the third insulated common gate electrode 530 may be formed between the third lower source/drain regions formed in the additional lower body layer pattern 540 of the one additional fin body pattern 645.

In addition, impurity ions of a first conductivity type may be implanted using the fourth insulated common gate electrode 630 as an ion implantation mask to form a pair of fourth upper source/drain regions spaced apart from each other in the other additional fin body pattern of the pair of additional fin body patterns 645. That is, a pair of fourth upper source/drain regions spaced apart from each other may be formed in the additional upper body layer pattern 640 of the other additional fin body pattern. Consequently, the fourth insulated common gate electrode 630 may be formed between the fourth upper source/drain regions formed in the additional upper body layer pattern 640 of the other additional fin body pattern 645. Similarly, Impurity ions of a second conductivity type different from the first conductivity type may be implanted using the fourth insulated common gate electrode 630 as an ion implantation mask to form a pair of fourth lower source/drain regions spaced apart from each other in the other additional fin body pattern. That is, a pair of fourth lower source/drain regions spaced apart from each other may be formed in the additional lower body layer pattern 540 of the other additional fin body pattern. Consequently, the fourth insulated common gate electrode 630 may be formed between the fourth lower source/drain regions formed in the additional lower body layer pattern 540 of the other additional fin body pattern 645.

Accordingly, when the third and fourth upper source/drain regions are P-type and the third and fourth lower source/drain regions are N-type, N-channel transfer transistors and P-channel transfer transistors may be sequentially stacked on the semiconductor substrate. In this case, the P-channel transfer transistors may act as inactive dummy transistors.

In addition, a word line WL may be formed which crosses the additional fin body patterns 645 and is electrically connected to the third and fourth insulated common gate electrodes 530 and 630. Further, first and second bit lines BL1 and BL2 may be formed which are electrically connected to the third and fourth lower drain regions of the third and fourth insulated common gate electrodes 530 and 630, respectively.

In the meantime, the third lower source region of the third insulated common gate electrode 530 may be electrically connected to one end of a third contact plug 370. Consequently, the third lower source region of the third insulated common gate electrode 530 may be electrically connected to the first upper and lower source/drain regions of the first insulated common gate electrode 230. Similarly, the fourth lower source region of the fourth insulated common gate electrode 630 may be electrically connected to one end of a fourth contact plug 375. Consequently, the fourth lower source region of the fourth insulated common gate electrode 630 may be electrically connected to the second upper and lower source/drain regions of the second insulated common gate electrode 330.

A second metal interconnection 380 may be formed which electrically connects the first insulated common gate electrode 230 and the fourth contact plug 375. Consequently, the first insulated common gate electrode 230, the drain region of the second insulated common gate electrode 330, and the source region of the fourth insulated common gate electrode 630 may be electrically connected to one another. Similarly, a third metal interconnection 385 may be formed which electrically connects the second insulated common gate electrode 330 and the third contact plug 370. Consequently, the second insulated common gate electrode 330, the drain region of the first insulated common gate electrode 230, and the source region of the third insulated common gate electrode 530 may be electrically connected to one another.

According to the present invention as described above, the driver transistor and the load transistor are stacked and these transistors are arranged to operate in response to a common gate electrode signal, so that the integration density and reliability of the CMOS SRAM cell may be enhanced.

Accordingly, as described above and illustrated by FIGS. 2 and 5, a complementary metal oxide semiconductor (CMOS) static random access memory (SRAM) cell according to an embodiment of the present invention includes at least a first inverter formed in a fin-shaped pattern 246 of stacked semiconductor regions of opposite conductivity type. The first inverter may include a first conductivity type (e.g., P-type or N-type) MOS load transistor 220 (or 320) electrically coupled in series with a second conductivity type (e.g., N-type of P-type) MOS driver transistor 210 (or 310). The first inverter is arranged so that active regions of the first conductivity type MOS load transistor and the second conductivity type driver transistor are vertically stacked relative to each other within a first portion of a vertical dual-conductivity semiconductor fin structure 246. This fin structure is surrounded on at least three sides by a wraparound gate electrode 230 (or 330), which is configured to modulate conductivity of both the active regions in response to a gate signal.

In some of these embodiments, the vertical dual-conductivity semiconductor fin structure 246 includes a first single crystal semiconductor pattern 240, a second semiconductor pattern 340 extending on the first single crystal semiconductor pattern 240 and an insulating layer 245 extending between the first single crystal semiconductor pattern 240 and the second semiconductor pattern 340. In some of these embodiments, the second semiconductor pattern 340 is a single crystal semiconductor pattern or a polysilicon semiconductor pattern. According to further aspects of these embodiments, the active region of the first conductivity type MOS load transistor 220 (or 320) extends within the second semiconductor pattern 340 and the active region of the second conductivity type driver transistor 210 (or 310) extends within the first single crystal semiconductor pattern 240. The second semiconductor pattern 340 may be P-type (or N-type) and the first single crystal semiconductor pattern 240 may be N-type (or P-type).

The CMOS SRAM cell according to embodiments of the invention also includes a pair of access (i.e., transfer) transistors 410, 420 (or 500, 600), which are responsive to a word line signal WL. One of these access transistors has a gate terminal responsive to a word line signal, a first current carrying terminal (e.g., source or drain) electrically connected to a first bit line and a second current carrying terminal (e.g., drain or source) electrically connected to drain terminals of the first conductivity type MOS load transistor and the second conductivity type MOS driver transistor. In some of these embodiments, the access transistors may be thin-film transistors (TFT) (see, e.g., FIG. 2), however, in other embodiments the access transistors may having active regions formed within single crystal semiconductor material located within a vertical fin-shaped structure (see, e.g., FIG. 5). In particular, an active region of the access transistor 610 may be formed within a second portion of the vertical dual-conductivity semiconductor fin structure 246.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A single port static random access memory (SRAM) cell, comprising:

a first inverter comprising a first conductivity type MOS load transistor electrically coupled in series with a second conductivity type MOS driver transistor and arranged so that first active regions of the first conductivity type MOS load transistor and the second conductivity type driver transistor are vertically stacked relative to each other within a first portion of a vertical dual-conductivity semiconductor fin structure that is surrounded on at least three sides by a first wraparound gate electrode, which is configured to modulate conductivity of both of the first active regions in response to a first gate signal;

a second inverter electrically connected to said first inverter in a cross-coupled relation so that an input of said first inverter is electrically coupled to an output of said second inverter and vice versa, said second inverter comprising a first conductivity type MOS load transistor electrically coupled in series with a second conductivity type MOS driver transistor and arranged so that second active regions of the first conductivity type MOS load transistor and the second conductivity type driver transistor are vertically stacked relative to each other within a second portion of the vertical dual-conductivity semiconductor fin structure that is surrounded on at least three sides by a second wraparound gate electrode, which is configured to modulate conductivity of both of the second active regions in response to a second gate signal;

a first access transistor electrically coupled to said first inverter, said first access transistor comprising a first transfer transistor electrically coupled to said first inverter and a first dummy transistor being of opposite conductivity type relative to the first transfer transistor and arranged so that active regions of the first transfer transistor and the first dummy transistor are vertically stacked relative to each other within a third portion of the vertical dual-conductivity semiconductor fin structure that is surrounded on at least three sides by a third wraparound gate electrode, which is configured to modulate conductivity of an active region of the first transfer transistor connected to a first bit line;

a second access transistor electrically coupled to said second inverter, said second access transistor comprising a second transfer transistor electrically coupled to said second inverter and a second dummy transistor being of opposite conductivity type relative to the second transfer transistor and arranged so that active regions of the second transfer transistor and the second dummy transistor are vertically stacked relative to each other within a fourth portion of the vertical dual-conductivity semiconductor fin structure that is surrounded on at least three sides by a fourth wraparound gate electrode, which is configured to modulate conductivity of an active region of the second transfer transistor connected to a second bit line.

2. The SRAM cell of claim 1, wherein the current carrying terminal of said first access transistor, which resides within the vertical dual-conductivity semiconductor fin structure, is electrically connected to a gate terminal of said second inverter; and wherein the current carrying terminal of said second access transistor, which resides within the vertical dual-conductivity semiconductor fin structure, is electrically connected to a gate terminal of said first inverter.

3. The SRAM cell of claim 2, wherein the first transfer transistor is an NMOS transistor and the first dummy transistor is a PMOS transistor that is not connected to the first bit line.

4. The SRAM cell of claim 1, wherein said first access transistor includes a first NMOS transistor; and wherein said second access transistor includes a second NMOS transistor.

5. The SRAM cell of claim 1, wherein the first active regions of the first conductivity type MOS load transistor and the second active regions of the first conductivity type MOS load transistor are single crystal silicon regions.

6. A single-port static random access memory (SRAM) cell, comprising:
- a first inverter comprising a first conductivity type MOS load transistor electrically coupled in series with a second conductivity type MOS driver transistor and arranged so that first active regions of the first conductivity type MOS load transistor and the second conductivity type driver transistor are vertically stacked relative to each other within a first portion of a vertical dual-conductivity semiconductor fin structure that is surrounded on at least three sides by a first wraparound gate electrode, which is configured to modulate conductivity of both of the first active regions in response to a first gate signal; and
- a first access transistor electrically coupled to said first inverter, said first access transistor comprising a first transfer transistor electrically coupled to said first inverter and a first dummy transistor being of opposite conductivity type relative to the first transfer transistor and arranged so that active regions of the first transfer transistor and the first dummy transistor are vertically stacked relative to each other within a second portion of the vertical dual-conductivity semiconductor fin structure that is surrounded on at least three sides by a second wraparound gate electrode, which is configured to modulate conductivity of an active region of the first transfer transistor connecting a first bit line.

7. The SRAM cell of claim 6, wherein the first transfer transistor is an NMOS transistor and the first dummy transistor is a PMOS transistor that is not connected to the first bit line.

* * * * *